United States Patent [19]

Enomoto et al.

[11] 4,276,556
[45] Jun. 30, 1981

[54] SEMICONDUCTOR DEVICE

[75] Inventors: Hiromu Enomoto, Kawasaki; Yasushi Yasuda, Inagi; Hitoshi Ohmichi, Kawasaki; Yoshiharu Mitono, Tokyo, all of Japan

[73] Assignee: Fujitsu Limited, Japan

[21] Appl. No.: 94,436

[22] Filed: Nov. 15, 1979

[30] Foreign Application Priority Data

Nov. 15, 1978 [JP] Japan .................... 53-157063[U]

[51] Int. Cl.³ .......................................... H01L 29/34
[52] U.S. Cl. ................................... 357/52; 357/15; 357/46; 357/48; 357/86
[58] Field of Search ................... 357/46, 52, 48, 15, 357/86

[56] References Cited

U.S. PATENT DOCUMENTS

| 3,577,043 | 5/1971 | Cook | 317/235 R |
|---|---|---|---|
| 3,748,187 | 7/1973 | Aubuchon et al. | 148/1.5 |
| 3,748,545 | 7/1973 | Beale | 317/235 R |
| 3,936,862 | 2/1976 | Moyle | 357/41 |
| 4,011,581 | 3/1977 | Kubo | 357/52 |
| 4,012,764 | 3/1977 | Satonaka | 357/68 |

Primary Examiner—Martin H. Edlow
Attorney, Agent, or Firm—Staas and Halsey

[57] ABSTRACT

A semiconductor device including a diode and a bipolar transistor which are connected to each other and formed in an isolated area of a semiconductor layer has a diffused region formed between a base region of the bipolar transistor and a formation region of the diode across the isolated area. The diffused region has the same conductivity type as that of the base region, so that a PNPN diode effect does not occur.

8 Claims, 4 Drawing Figures

SEMICONDUCTOR DEVICE

BACKGROUND OF THE INVENTION

1. Field of the Invention

This invention relates to a semiconductor device, and more particularly to an improved semiconductor device including a bipolar transistor and a diode which are connected to each other and formed in an isolated area of a semiconductor layer.

2. Description of the Prior Art

Generally, as can be seen in FIG. 1, a bipolar transistor Q and a PN junction diode (or a schottky barrier diode) are often connected in a series for use in, for example, a TTL (transistor transistor logic) circuit. FIG. 1 is a schematic diagram of a semiconductor device consisting of a bipolar transistor and a diode. When an output of the transistor Q is taken out at a point indicated by the arrow $Qt_1$, the obtained voltage level is the voltage Vce between the collector and emitter of the transistor Q. When an output of the transistor Q is taken out at a point indicated by the arrow $Qt_2$, the obtained voltage level is the total voltage of the voltage Vce and a forward biased voltage Vf of the diode D.

In order to produce the semiconductor device illustrated in FIG. 1, the bipolar transistor Q and diode D have been formed in each of isolated areas, and then they have been connected with a conductor. Thus, since two isolated areas are required for producing the semiconductor device, it is difficult to produce a semiconductor device of a small size.

In the production of IC or LSI semiconductor devices including the above-mentioned semiconductor device comprised of a bipolar transistor and a diode, there was an attempt made to form the bipolar transistor and diode in one isolated area, whereby the area required for the semiconductor device could be further reduced (for example, it is possible to reduce the required area by 20~30% as compared with that for forming the semiconductor device in isolated areas). FIG. 2 is a cross-sectional view of a semiconductor device which is formed in an isolated area and corresponds to the diagram of FIG. 1. In FIG. 2, the reference numerals 1, 2, 3, 4 and 5 represent a p-type silicon semiconductor substrate, an n+-type buried layer, an n-type epitaxially grown silicon semiconductor layer, a silicon dioxide insulating film and a surrounding p+-type isolation region, respectively. Furthermore, the reference numerals 6, 7, 8 and 9 represent a p+-type base region of the bipolar transistor, a p+-type region for the diode, an n+-type emitter region and an n+-type collector contact region, respectively. Thus, the PN junction comprised of the p+-type region 7 and the n-type epitaxial semiconductor layer 3 forms a diode, and the base region 6, emitter region 8 and collector region (i.e. a part of the epitaxial semiconductor layer 3) form an NPN transistor in the isolated epitaxial semiconductor layer 3.

However, in such a structure, the region 7, the epitaxial semiconductor layer 3, the base region 6 and the emitter region 8 form a PNPN diode i.e. a thyristor, and it is easy to turn on the PNPN diode by a small current, e.g. a few microamperes in the worst case, namely, a so-called PNPN diode effect occurs.

It is possible to form a schottky barrier diode instead of the above-mentioned PN junction diode. In this case, the semiconductor device comprised of the schottky barrier diode and the above-mentioned transistor functions normally at a small current, e.g. less than 3 mA, but the semiconductor device does not function normally, namely a PNPN diode is turned on by a large current, e.g. more than 3 mA.

SUMMARY OF THE INVENTION

An object of the present invention is to provide a semiconductor device comprising a diode and a bipolar transistor which is formed in an isolated area and does not have a PNPN diode function under usual operating conditions.

Another object of the present invention is to prevent the PNPN diode from turning on in the semiconductor device.

In accordance with the present invention, the above objects and other objects are attained by a semiconductor device comprising a diode and a bipolar transistor which are connected to each other and formed in an isolated area of a semiconductor layer, wherein the semiconductor device has a diffusion region which is formed between a base region of the transistor and a formation region of the diode, traverses the isolated area and has the same conductivity type as that of the base region, and which is separated by a portion of said isolated area from a buried layer between said isolated area and said substrate, said diffusion region electrically connecting with a region of the semiconductor layer having the same conductivity type to define each said isolated area of said semiconductor layer.

The invention will become more apparent from the detailed description of the invention set forth below, with reference to the accompanying drawings.

DETAILED DESCRIPTION OF THE INVENTION

Figure 1:
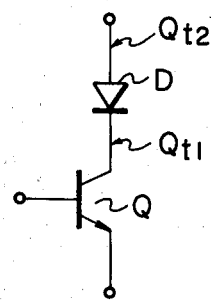
FIG. 1 is a schematic diagram of a semiconductor device consisting of a diode and a bipolar transistor.
Figure 2:
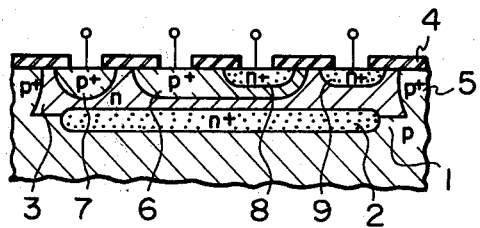
FIG. 2 is a cross-sectional view of a semiconductor device which is formed in an isolated area and corresponds to the diagram of FIG. 1.
Figure 3:
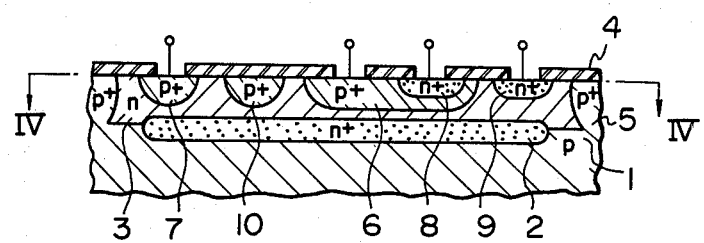
FIG. 3 is a cross-sectional view of a semiconductor device according to the present invention which corresponds to the diagram of FIG. 1.

In FIG. 3, the reference numerals 1 through 9 represent the same parts as those represented by the reference numerals 1 through 9 in FIG. 2, respectively.

Figure 4:
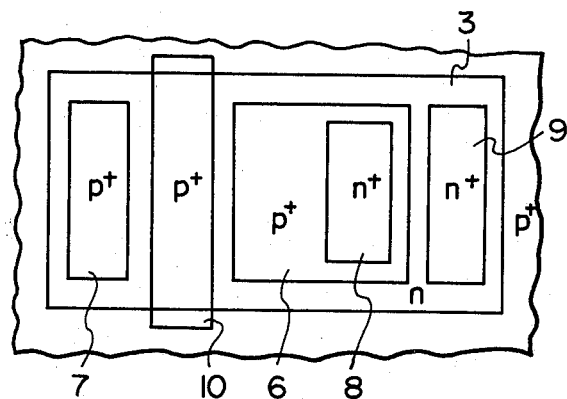
FIG. 4 is a plan view taken along line IV—IV of FIG. 3.

A difference between the semiconductor device according to the present invention in FIGS. 3 and 4 and the semiconductor device in FIG. 2 is the formation of a p+-type region 10 which is formed between the p+-type base region 6 and the p+-type region 7 and traverses the upper part of the isolated epitaxial semiconductor layer 3. It is preferable to make the depth of the p+-type region 10 the same as that of the base region 6 and the p+-type region 7 by simultaneously forming these regions 10, 6 and 7. The formed p+-type region 10 prevents the formation of the above-mention parasitic PNPN diode (i.e. thyristor). Since the formed P+-type region 10 is connected with the surrounding P+-type isolation region 5 having the most negative potential, minority carriers arising at the p+-type region 7 are almost totally absorbed by the formed region 10 and hardly flow into the p+-type region 6.

It is possible in this manner to form a schottky barrier diode instead of the diode illustrated in FIG. 3. In this case, the semiconductor device comprised of the schottky barrier diode and the bipolar transistor can function normally at a large current, e.g. more than 100 mA.

The semiconductor device illustrated in FIGS. 3 and 4 is produced as follows. The starting material is a p-type silicon semiconductor substrate 1. Donor impurity (e.g. P, As or Sb) is diffused into a part of the silicon subtrate 1 to form an n+-type buried layer 2. On the silicon substrate 1 an n-type epitaxial silicon semiconductor layer 3 is grown. A silicon dioxide film (not illustrated in FIG. 3) is formed on the epitaxial layer 3. A part of the silicon dioxide film is removed by a conventional photo etching process to expose a part of the epitaxial layer 3. The acceptor impurity (e.g. B, Ga or In) is diffused into the exposed part of the epitaxial layer 3 to form a p+-type region 5, i.e. a surrounding isolation region. Thus, an isolated area, i.e. an isolated n-type epitaxial silicon semiconductor layer 3 is formed. After removing the remaining silicon dioxide film, an other silicon dioxide film is re-formed on the entire surface of the epitaxial layer and then three parts of the formed silicon dioxide film are removed by a photo etching process. The acceptor impurity is diffused into three exposed parts of the isolated area 3 to form a p+-type base region 6 of a bipolar transistor, a p+-type region 7 for a diode and a p+-type region 10 which lies between the regions 6 and 7 across the isolated area 3. After removing the remaining silicon dioxide film, a silicon dioxide film is again re-formed and then two parts of this re-formed silicon dioxide film are removed by a photo etching process. A donor impurity is diffused into two exposed parts of the isolated area 3 to form an n+-type emitter region 8 and an n+-type collector contact region 9 of the bipolar transistor. After removing the remaining silicon dioxide film, a silicon dioxide insulating film 4 is re-formed on the entire surface of the isolated area 3. Four parts of the formed silicon dioxide film 4 are removed by a photo etching process and then a conductor film, e.g. Al is deposited on the entire top surface by a conventional evaporation process. Finally, the deposited conductor film is etched to form a desired pattern of contacts by a photo etching process.

It is possible to form a schottky barrier diode instead of the diode formed by the above-mentioned procedure by a conventional technique.

It will be obvious to those skilled in the art that the present invention is not restricted to the abovedescribed embodiments of the present invention, and that many variations are possible for those skilled in the art without departing from the scope of the present invention.

What is claimed is:

1. A semiconductor device including a diode and a bipolar transistor which are connected to each other and formed in an isolated area of a semiconductor layer of a first conductivity type formed on a semiconductor substrate of the opposite conductivity type, said isolated area comprising a portion of said layer that is surrounded by an isolation region comprising a heavily doped region of said opposite conductivity type extending from the surface of said semiconductor layer at least to said substrate, said isolated area serving as the collector of said transistor and having a base region of said transistor formed therein of said opposite conductivity type, said semiconductor device comprising a buried region heavily doped with impurities of said first conductivity type located between said layer and said substrate, said buried layer separated from said isolation region, and a diffusion region of said opposite conductivity type formed between the base region of said bipolar transistor and a region of said isolated area where said diode is formed, and which traverses said isolated area to connect with said isolation region, said diffusion region being separated from said buried region by a portion of said layer.

2. A semiconductor device according to claim 1, characterized in that said diode is a PN junction diode.

3. A semiconductor device according to claim 1, characterized in that said diode is a schottky barrier diode.

4. A semiconductor device according to claim 1, characterized in that said opposite conductivity type is P type.

5. A semiconductor device according to claim 1, characterized in that said bipolar transistor is NPN type.

6. The device of claim 3, said connected schottky barrier diode and bipolar transistor comprising means for functioning normally at current levels of up to 100 mA.

7. A semiconductor device according to claim 1, said diffusion region having the same depth as that of said base region of said transistor.

8. The device of claim 7, the diode comprising a region of said opposite conductivity type formed in said isolated region to have a depth equal to that of said base region of said transistor and said diffusion region.

* * * * *

UNITED STATES PATENT AND TRADEMARK OFFICE
CERTIFICATE OF CORRECTION

PATENT NO. : 4,276,556
DATED : June 30, 1981
INVENTOR(S) : Hiromu Enomoto et al.

It is certified that error appears in the above—identified patent and that said Letters Patent is hereby corrected as shown below:

On The Title Page Assignee, should read -- Fujitsu Limited, Kawasaki-shi, Kanagawa, Japan --.

Column 3, line 22, "an other" should read -- another --.

line 50, "abovedescribed" should read -- above-described --.

Signed and Sealed this

*Twenty-second* Day of *December 1981*

|SEAL|

*Attest:*

GERALD J. MOSSINGHOFF

*Attesting Officer*     *Commissioner of Patents and Trademarks*